(12) United States Patent
Bronzi

(10) Patent No.: US 10,564,450 B1
(45) Date of Patent: Feb. 18, 2020

(54) ELECTRICAL AMPLIFIER AND ELECTRO-OPTICAL DEVICE COMPRISING AN ELECTRICAL AMPLIFIER

(71) Applicant: Sicoya GmbH, Berlin (DE)

(72) Inventor: Danilo Bronzi, Berlin (DE)

(73) Assignee: SICOYA GMBH, Berlin (DE)

( * ) Notice: Subject to any disclaimer, the term of this patent is extended or adjusted under 35 U.S.C. 154(b) by 0 days.

(21) Appl. No.: 16/246,258

(22) Filed: Jan. 11, 2019

(51) Int. Cl.
*G02F 1/035* (2006.01)
*G02F 1/01* (2006.01)
*H03F 3/217* (2006.01)
*G02F 1/025* (2006.01)
*G02F 1/225* (2006.01)

(52) U.S. Cl.
CPC .......... *G02F 1/0356* (2013.01); *G02F 1/0121* (2013.01); *G02F 1/025* (2013.01); *G02F 1/2255* (2013.01); *H03F 3/217* (2013.01)

(58) Field of Classification Search
CPC ........ G02F 1/0121; G02F 1/015; G02F 1/025; G02F 1/035; G02F 1/0356; G02F 1/21; G02F 1/225; G02F 1/2255; H03F 3/20; H03F 3/21; H03F 3/211; H03F 3/213; H03F 3/217; H03F 3/2171; H03F 3/2173; H03F 3/2175; H03F 3/2176; H03F 3/2178
See application file for complete search history.

(56) References Cited

U.S. PATENT DOCUMENTS

| 6,707,589 | B2 * | 3/2004 | Bostak | G02F 1/0121 345/100 |
| 7,848,369 | B1 * | 12/2010 | Bostak | G02F 1/0121 359/237 |
| 8,248,161 | B2 * | 8/2012 | Syed | H03F 1/26 330/253 |

OTHER PUBLICATIONS

Enrico Temporiti et al., "Insights Into Silicon Photonics Mach-Zehnder-Based Optical Transmitter Architectures"; IEEE Journal of Solid-State Circuits; vol. 51; No. 12; Dec. 2016; pp. 3178-3191.

* cited by examiner

*Primary Examiner* — Lincoln D Donovan
*Assistant Examiner* — Diana J. Cheng
(74) *Attorney, Agent, or Firm* — Gordon Rees Scully Mansukhani LLP

(57) ABSTRACT

An exemplary embodiment of the present invention relates to an electrical amplifier comprising a differential preamplifier having a first output port and a second output port; a first output unit connected to the first output port of the differential preamplifier and a second output unit connected to the second output port of the differential preamplifier, the first and second output units being electrically arranged in parallel relative to each other; and a positive feedback loop that couples the first and second output units and comprises a first capacitor and a second capacitor; wherein each of the first and second output units comprises an emitter-follower unit and a bias transistor that is connected in series with the emitter-follower unit of its output unit; wherein an emitter of (Continued)

the emitter-follower unit of the first output unit is connected to a base of the bias transistor of the second output unit through the first capacitor of the positive feedback loop; and wherein an emitter of the emitter-follower unit of the second output unit is connected to a base of the bias transistor of the first output unit through the second capacitor of the positive feedback loop.

20 Claims, 7 Drawing Sheets

US 10,564,450 B1

ELECTRICAL AMPLIFIER AND ELECTRO-OPTICAL DEVICE COMPRISING AN ELECTRICAL AMPLIFIER

The invention relates to electrical amplifiers, methods of amplifying electrical signals, and electro-optical devices comprising electrical amplifiers.

BACKGROUND OF THE INVENTION

Optical communication systems employ a variety of voltage-driven devices to generate light modulation. One of the most commonly used devices is the Mach-Zehnder interferometric modulator (MZM). The MZM has a wavelength-independent transfer function; besides, it can be operated in a dual electrode structure, that—in comparison to a single electrode modulator—requires lower driving voltages and provides chirp-free optical output.

For a SiPh MZM, a reverse-biased junction is typically used to generate the electro-optical effect. One drawback of this approach is that a reverse-biased junction has very small capacitance and therefore a long modulator with relatively high driving voltage and losses is needed to achieve the required extinction ratio. Travelling wave electrode or distributed amplifiers are the most common driving schemes.

To reduce the size and the losses of the modulator, a forward-biased junction is to be preferred. A forward-biased junction works as an injection device and—as such—it has very large capacitance (>1 pF) to create enough extinction ratio, given its short length. In order to drive this heavy load, a low impedance driver is required. The best driver would consist of a B-class output stage; also known as push-pull. In a CMOS technology this implementation is straightforward, but in bipolar technologies, where usually only lateral PNP transistors are available, the most suitable stage is the emitter follower (EF).

In an EF, when the output goes high not all the current from the top transistor is available to charge the load, because some of the current is lost by flowing through the bias transistor, thus slowing down the transition time.

One way to circumvent this shortcoming is to provide an auxiliary path for the signal to activate the bias transistors during the transitions, turning it into active pull-down element, that sinks or sources an extra amount of current from or into the output node, thus speeding up the transitions.

This principle has been described in U.S. Pat. No. 6,707,589 B2 and employed for a single-ended EAM driver. The same principle is also applied for a differential MZM driver in a paper by Enrico Temporiti et al. entitled "Insights Into Silicon Photonics Mach-Zehnder-Based Optical Transmitter Architectures" IEEE Journal of Solid-State Circuits (Vol. 51, No. 12, pp. 3178-3191, December 2016).

One shortcoming of the foregoing implementations is that the load capacitance seen by the predriver stage (hereinafter also referred to as preamplifier) is increased by the series capacitance of the coupling capacitor and the input capacitance of the pull-down device, therefore it is not possible to improve the output transition times without impairing the bandwidth of the predriver. This is especially true when low power and high voltage swings are required.

It is possible to include additional buffers between the predriver and the output stage, but this would cause an increase in the overall current consumption. Besides, as shown in U.S. Pat. No. 6,707,589 B2, the supplementary buffers demand a higher supply voltage to prevent the saturation of the pull-down element, which turns into extra power consumption.

OBJECTIVE OF THE PRESENT INVENTION

An objective of the present invention is to provide an improved electrical amplifier.

A further objective of the present invention is to provide an improved method of amplifying electrical signals.

A further objective of the present invention is to provide an improved electro-optical device.

BRIEF SUMMARY OF THE INVENTION

An embodiment of the present invention relates to an electrical amplifier comprising a differential preamplifier having a first output port and a second output port; a first output unit connected to the first output port of the differential preamplifier and a second output unit connected to the second output port of the differential preamplifier, the first and second output units being electrically arranged in parallel relative to each other; and a positive feedback loop that couples the first and second output units and comprises a first capacitor and a second capacitor; wherein each of the first and second output units comprises an emitter-follower unit and a bias transistor that is connected in series with the emitter-follower unit of its output unit; wherein an emitter of the emitter-follower unit of the first output unit is connected to a base of the bias transistor of the second output unit through the first capacitor of the positive feedback loop; and wherein an emitter of the emitter-follower unit of the second output unit is connected to a base of the bias transistor of the first output unit through the second capacitor of the positive feedback loop.

The positive feedback loop of the amplifier may decrease the transition times at output ports of the amplifier. Therefore, the amplifier may be used as a modulator driver circuit (e.g. for electro-optical devices such as MZM modulators) with improved switching speed and power consumption. Although the proposed amplifier is specifically designed for a SiPh MZM, it could of course be used with other types of optical modulators.

The emitter of the emitter-follower unit of the first output unit preferably forms a first output port of the electrical amplifier.

The emitter of the emitter-follower unit of the second output unit preferably forms a second output port of the electrical amplifier.

The base of the bias transistor of the first and/or second output unit is preferably also connected to a common voltage source via a resistor.

The first output port of the differential preamplifier is preferably connected to a base of the emitter-follower unit of the first output unit.

The second output port of the differential preamplifier is preferably connected to a base of the emitter-follower unit of the second output unit.

The first output unit preferably comprises an inner series circuit and an outer series circuit.

The inner series circuit of the first output unit preferably comprises said emitter-follower unit of the first output unit, hereinafter referred to as the inner emitter-follower unit, and said bias transistor of the first output unit, hereinafter referred to as the inner bias transistor. The inner bias transistor is preferably connected in series with the inner emitter-follower unit.

The emitter of the emitter-follower unit of the second output unit is preferably connected to a base of the inner bias transistor of the first output unit through the second capacitor of the positive feedback loop.

The emitter of the inner emitter-follower unit of the first output unit is preferably connected to the base of the bias transistor of the second output unit through the first capacitor of the positive feedback loop.

The emitter of the outer emitter-follower unit preferably forms the first output port of the electrical amplifier.

The first output port of the differential preamplifier is preferably connected to both a base of the inner emitter-follower unit and a base of the outer emitter-follower unit.

The inner series circuit of the first output unit preferably comprises an impedance connected to the emitter of the inner bias transistor. The impedance preferably comprises a parallel resonant circuit having a resistance in parallel with a first auxiliary capacitor.

The second output unit preferably comprises an impedance connected to an emitter of the bias transistor of the second output unit. The impedance of the second output unit preferably comprises a parallel resonant circuit having a resistance in parallel with a second auxiliary capacitor.

According to a preferred embodiment, the first output unit comprises a first inner series circuit and a first outer series circuit, wherein the first inner and outer series circuits are connected in parallel. The second output unit preferably comprises a second inner series circuit and a second outer series circuit, wherein the second inner and outer series circuits are connected in parallel.

The first inner series circuit preferably comprises said emitter-follower unit of the first output unit, hereinafter referred to as the first inner emitter-follower unit, as well as said bias transistor of the first output unit, hereinafter referred to as the first inner bias transistor. The first inner bias transistor is preferably connected in series with the first inner emitter-follower unit.

The first outer series circuit preferably comprises a first outer emitter-follower unit and a first outer bias transistor connected in series with the first outer emitter-follower unit.

The second inner series circuit preferably comprises said emitter-follower unit of the second output unit, hereinafter referred to as the second inner emitter-follower unit, as well as said bias transistor of the second output unit, hereinafter referred to as the second inner bias transistor.

The second inner bias transistor is preferably connected in series with the second inner emitter-follower unit.

The second outer series circuit preferably comprises a second outer emitter-follower unit and a second outer bias transistor connected in series with the second outer emitter-follower unit.

The emitter of the second inner emitter-follower unit is preferably connected to both a base of the first inner bias transistor and a base of the first outer bias transistor through the second capacitor of the positive feedback loop.

The emitter of the first inner emitter-follower unit is preferably connected to both a base of the second inner bias transistor and a base of the second outer bias transistor through the first capacitor of the positive feedback loop.

The first output port of the differential preamplifier is preferably connected to both a base of the first inner emitter-follower unit and a base of the first outer emitter-follower unit.

The second output port of the differential preamplifier is preferably connected to both a base of the second inner emitter-follower unit and a base of the second outer emitter-follower unit.

The emitter of the first outer emitter-follower unit preferably forms a first output port of the electrical amplifier.

The emitter of the second outer emitter-follower unit preferably forms a second output port of the electrical amplifier.

The base of the first inner bias transistor is preferably connected to a common voltage source via a first resistor.

The base of the second inner bias transistor is preferably connected to the same or another common voltage source via a second resistor.

The emitter of the first inner bias transistor is preferably connected to a reference potential through a first impedance.

The emitter of the second inner bias transistor is preferably connected to the same or another reference potential through a second impedance.

Preferably, all of the emitter-follower units are or comprise npn-bipolar transistors.

Preferably, all of the bias transistors are npn-bipolar transistors.

A further embodiment of the present invention relates to a method of amplifying an electrical signal comprising the steps of:
  pre-amplifying a differential input signal with a differential preamplifier having a first output port and a second output port;
  feeding a first pre-amplified signal of the differential preamplifier into a first output unit and a second pre-amplified signal of the differential preamplifier into a second output unit, the first and second output units being electrically arranged in parallel relative to each other; and
  providing a positive feedback by coupling the first and second output units via a first capacitor and a second capacitor;
  wherein each of the first and second output units comprises an emitter-follower unit and a bias transistor that is connected in series with the emitter-follower unit of its output unit;
  wherein an emitter of the emitter-follower unit of the first output unit is connected to a base of the bias transistor of the second output unit through the first capacitor; and
  wherein an emitter of the emitter-follower unit of the second output unit is connected to a base of the bias transistor of the first output unit through the second capacitor.

A further embodiment of the present invention relates to an electro-optical device comprising an electrical amplifier comprising
  a differential preamplifier having a first output port and a second output port;
  a first output unit connected to the first output port of the differential preamplifier and a second output unit connected to the second output port of the differential preamplifier, the first and second output units being electrically arranged in parallel relative to each other; and
  a first capacitor and a second capacitor that both couple the first and second output units;
  wherein each of the first and second output units comprises an emitter-follower unit and a bias transistor that is connected in series with the emitter-follower unit of its output unit;
  wherein an emitter of the emitter-follower unit of the first output unit is connected to a base of the bias transistor of the second output unit through the first capacitor; and wherein an emitter of the emitter-follower unit of the second output unit is connected to a base of the bias transistor of the first output unit through the second capacitor.

The electro-optical device may further comprise an electro-optical modulator having at least one input port for inputting a modulation signal, wherein at least one output port of the electrical amplifier is connected to said at least one input port of the electro-optical modulator.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings. It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Figure 1:
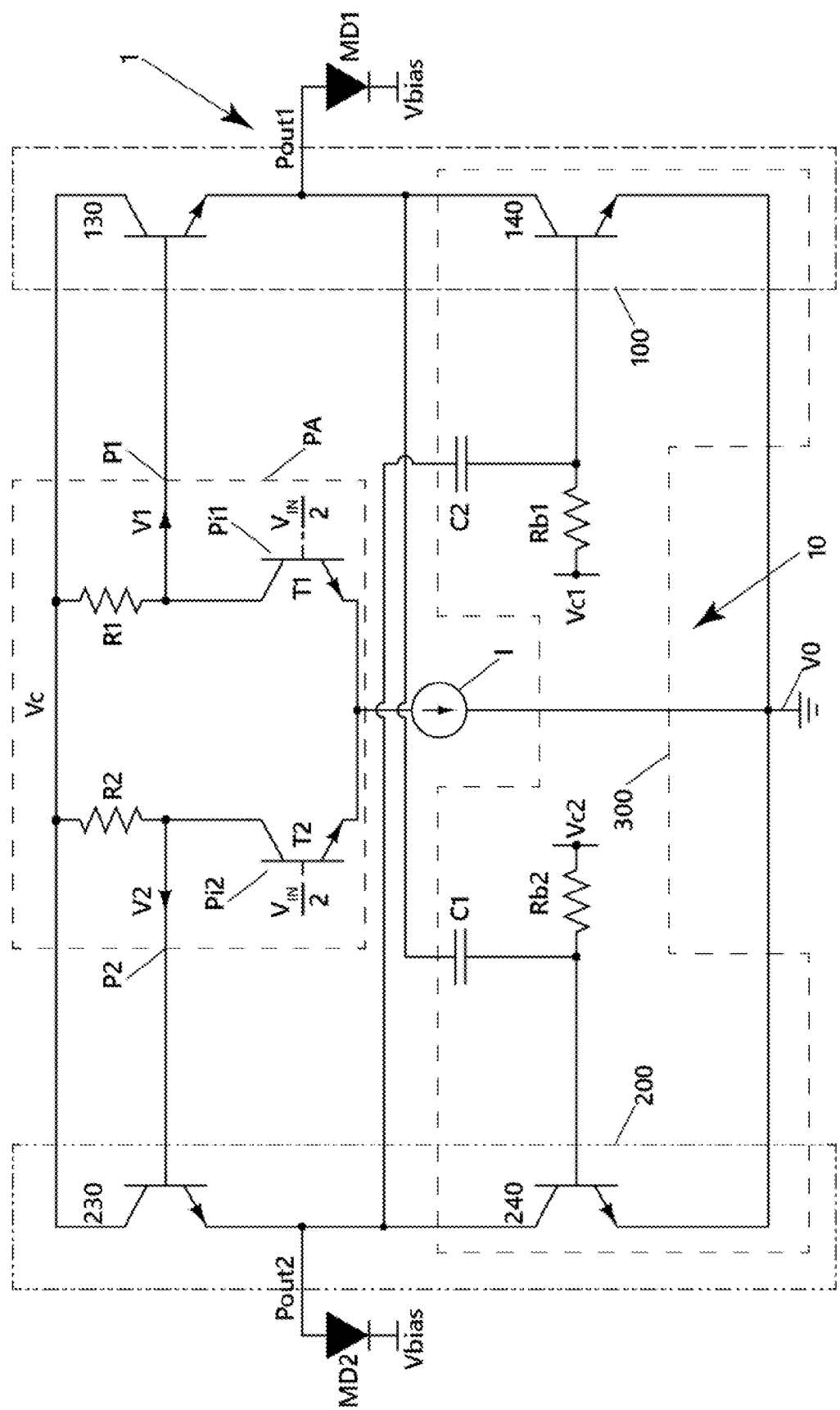
FIG. 1 illustrates a first exemplary embodiment of an electro-optical device and an electrical amplifier according to the present invention.

FIG. 1 shows a first exemplary embodiment of an electro-optical device 1 and an electrical amplifier 10 according to the present invention. The electrical amplifier 10 is connected to a supply voltage Vc, a reference potential V0, and two loads MD1 and MD2. The loads MD1 and MD2 may be diodes of a Mach-Zehnder interferometric modulator (MZM) e.g. based on SiPh. The diodes are preferably assigned to opposite interferometer arms of the MZM in order to increase their influence on the optical signal generated by the Mach-Zehnder interferometric modulator.

The electrical amplifier 10 comprises a differential preamplifier PA. In the exemplary embodiment of FIG. 1, the differential preamplifier PA comprises resistors R1 and R2, transistors (preferably npn-bipolar transistors) T1 and T2 and a current source providing a constant current I.

Input ports Pi1 and Pi2 of the differential preamplifier PA allow inputting of a differential input signal ±Vin/2. In response, the differential preamplifier PA generates a first pre-amplified signal V1 at a first output port P1 of the differential preamplifier PA, and a second pre-amplified signal V2 at a second output port P2 of the differential preamplifier PA.

The electrical amplifier 10 further comprises a first output unit 100 that is connected to the first output port P1 of the differential preamplifier PA, and a second output unit 200 that is connected to the second output port P2 of the differential preamplifier PA.

The first output unit 100 comprises an emitter-follower unit 110 and a bias transistor 120 that is connected in series with the emitter-follower unit 110. The emitter-follower unit 110 and the bias transistor 120 may be bipolar transistors (preferably npn-transistors) or may comprise bipolar transistors (preferably npn-transistors). The base of the bias transistor 120 of the first output unit 100 is connected to a constant common voltage source Vc1 via a resistor Rb1.

The second output unit 200 comprises an emitter-follower unit 210 and a bias transistor 220 that is connected in series with the emitter-follower unit 210. The emitter-follower unit 210 and the bias transistor 220 may be bipolar transistors (preferably npn-transistors) or may comprise bipolar transistors (preferably npn-transistors). The base of the bias transistor 220 of the second output unit 200 is connected to a constant common voltage source Vc2 via a resistor Rb2. The constant common voltage source Vc2 may be the same as the constant common source voltage Vc1. The resistors Rb1 and Rb2 may be identical.

The first output port P1 of the differential preamplifier PA is connected to a base of the emitter-follower unit 110 of the first output unit 100. The second output port P2 of the differential preamplifier PA is connected to a base of the emitter-follower unit 110 of the first output unit 100.

The first output unit 100 and the second output unit 200 are electrically arranged in parallel relative to each other as well as parallel to the preamplifier PA.

In the exemplary embodiment of FIG. 1, the emitter of the emitter-follower unit 110 of the first output unit 100 forms a first output port Pout1 of the electrical amplifier 10. The emitter of the emitter-follower unit 110 of the second output unit 200 forms a second output port Pout2 of the electrical amplifier 10. The electrical amplifier 10 is therefore dual-ended and allows feeding the two loads MD1 and MD2 with inverse inputs signals.

The electrical amplifier 10 further comprises a positive feedback loop 300 that couples the first output unit 100 and the second output unit 200 and comprises a first capacitor C1 and a second capacitor C2. In the exemplary embodiment of FIG. 1, the positive feedback loop 300 consists of the capacitors C1 and C2 and the bias transistors 140 and 240.

The first capacitor C1 of the positive feedback loop 300 connects an emitter of the emitter-follower unit 110 of the first output unit 100 and a base of the bias transistor 220 of the second output unit 200.

The second capacitor C2 of the positive feedback loop 300 connects an emitter of the emitter-follower unit 210 of the second output unit 200 and base of the bias transistor 120 of the first output unit 100.

In the exemplary embodiment of FIG. 1, the differential pair of transistors T1 and T2 together with the collector resistors R1 and R2 provide the voltage swing necessary to generate an electro-optical effect in the loads MD1 and MD2. The two emitter-follower units 110 and 210 offer a low-impedance output and therefore comparably large output currents compared to the output currents of the preamplifier PA alone.

As described above, each of the emitters of the emitter-follower units 110 and 210 are coupled to the bases of the bias transistors 210 and 120, respectively, via the capacitors C1 and C2, thereby forming a differential pseudo push-pull arrangement. This differential pseudo push-pull arrangement creates a positive feedback loop that significantly speeds up the transition time. Indeed, when the output port Vout1 goes high, the base voltage of the bias transistors 220 will raise, speeding up the discharging of the output port Vout2. Consequently, the base voltage at the bias transistors 120 will lower faster; which, in turn, causes more current to flow into the load MD1, so that the output port Vout1 will go high even faster, and so on. The loop 300 is self-sustaining only during signal transitions and until the voltage at the bases of the bias transistors 120 and 220 is back to its steady-state value.

Since the coupling capacitors C1 and C2 are connected to the output ports Vout1 and Vout2, they have no influence on the bandwidth of the preamplifier PA, so that the preamplifier PA can be optimized for low power consumption, i.e. having low bias current and high output resistance.

Figure 5:
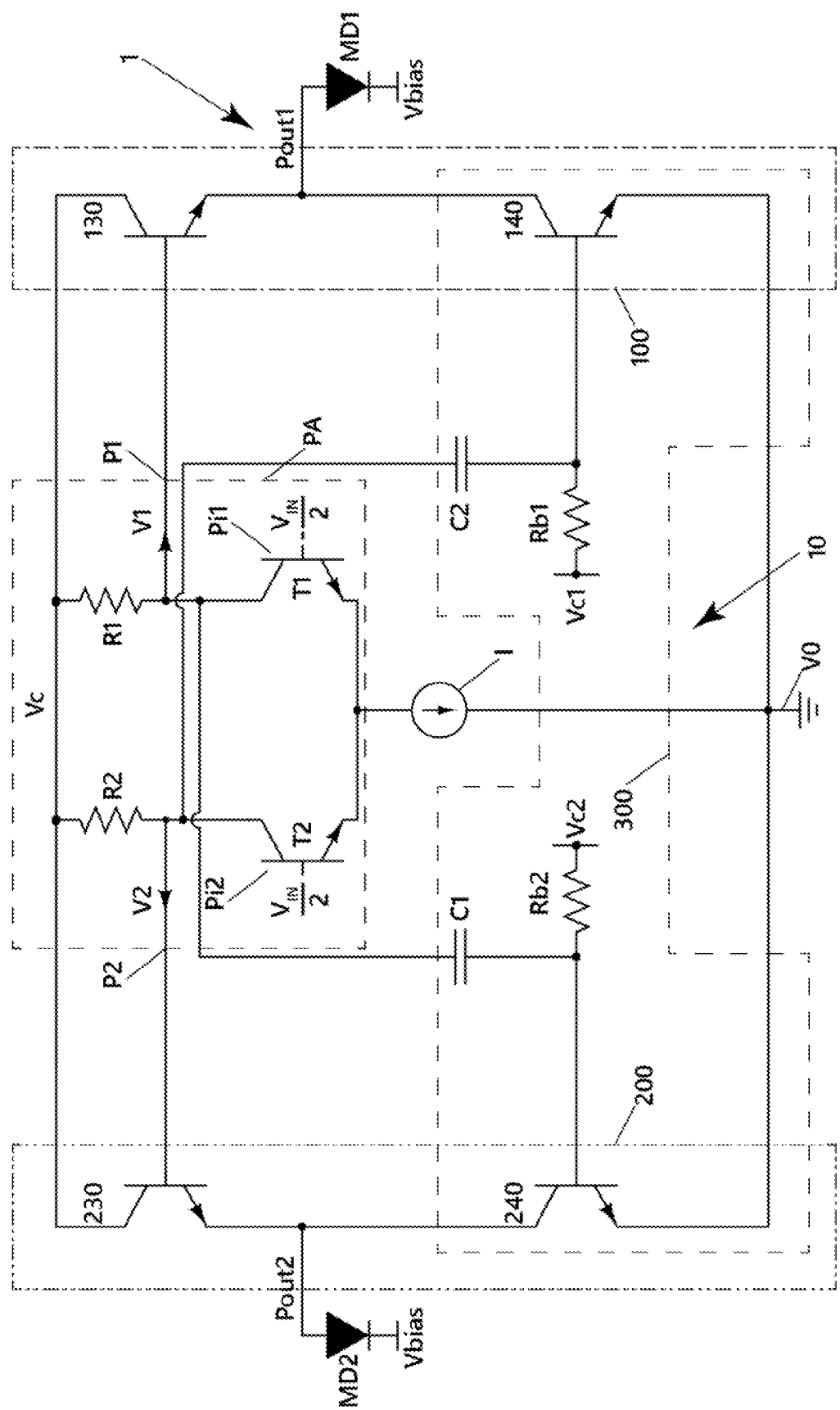
FIG. 5 illustrates an electrical amplifier without positive feedback loop.

In order to visualize the effect of the positive feedback loop 300 of FIG. 1, FIG. 5 shows an embodiment without positive feedback loop. In FIG. 5, the coupling capacitors C1 and C2 are coupled to the preamplifier PA and can therefore not form a positive feedback loop. The positive effect on the speed of the signal transitions, as explained in connection with FIG. 1, is therefore not present in the embodiment of FIG. 5. The embodiment of FIG. 5 is similar to prior art.

Figure 6:
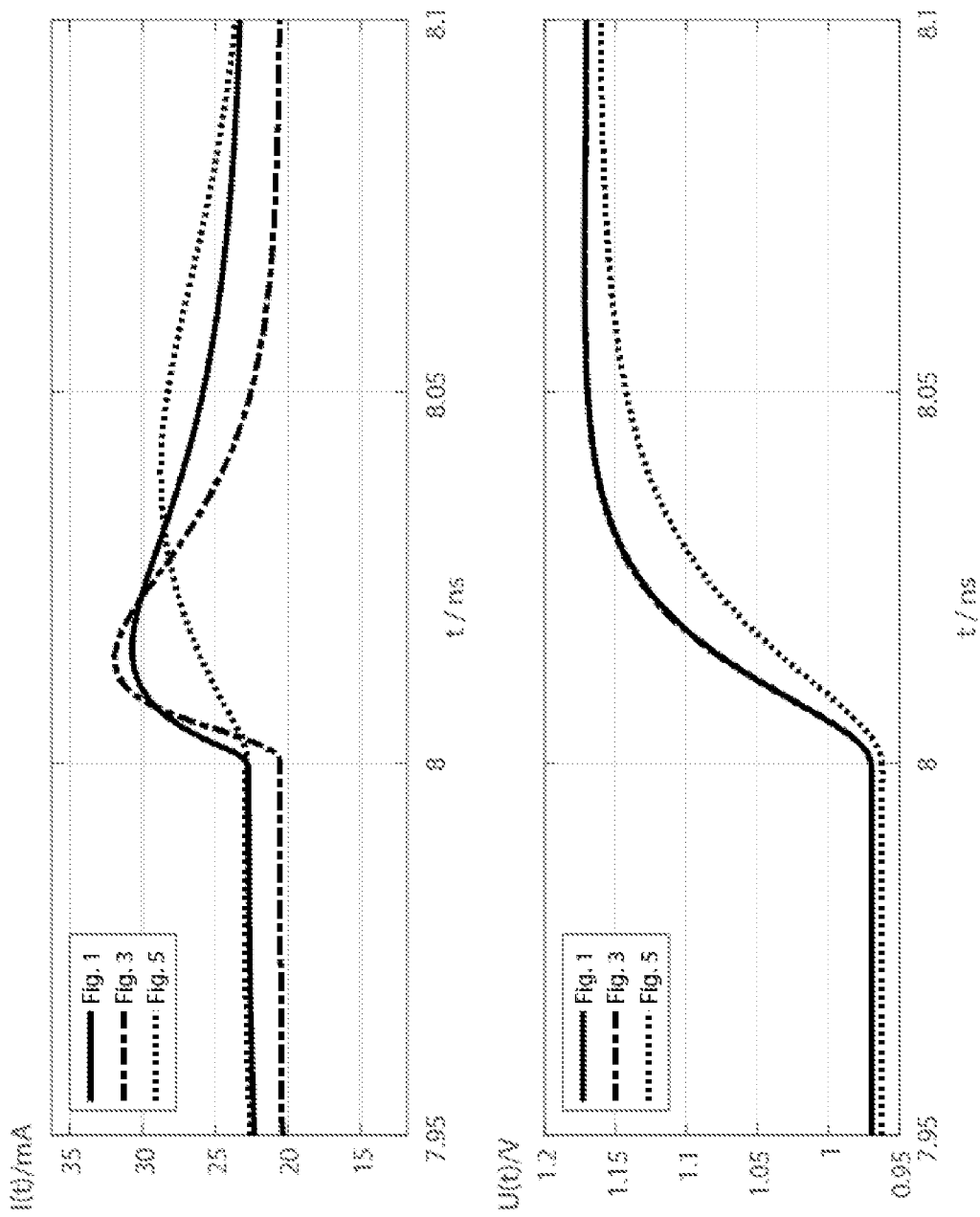
FIG. 6 illustrates time-domain simulations depicting the voltage pulse response U(t) and the pull-down current I(t) over time t for the embodiments of FIGS. 1, 3 and 5.

FIG. 6 shows time-domain simulations depicting the voltage pulse response U(t) and the pull-down current I(t) over time t for the embodiments of FIGS. 1 and 5. It can be seen that the transition time is significantly smaller in the embodiment of FIG. 1 compared to the embodiment of FIG. 5. A further improvement can be achieved by additional measures explained further below in connection with FIG. 3.

Figure 2:
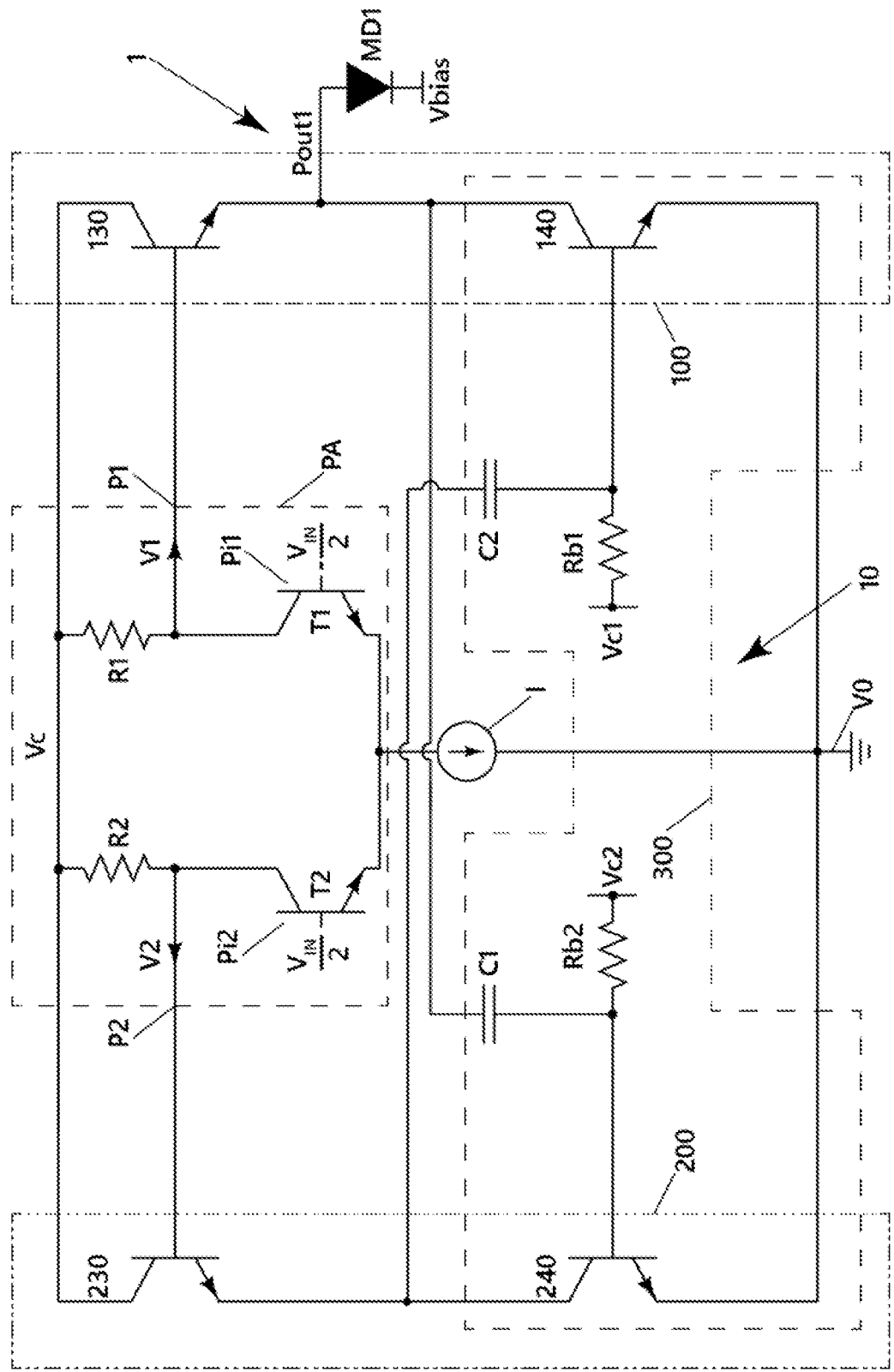
FIG. 2 illustrates a second exemplary embodiment of an electro-optical device and an electrical amplifier according to the present invention.

FIG. 2 shows a second exemplary embodiment of an electro-optical device 1 and an electrical amplifier 10 according to the present invention. The electrical amplifier 10 of FIG. 2 is single-ended and provides a single output Vout1, only. The other features of the second embodiment of FIG. 2 are identical with those of the first embodiment of FIG. 1. Therefore, the explanations above with respect to the positive feedback loop 300 and its positive effect on the speed (e.g. the transition times of signal edges) are valid for the second exemplary embodiment as well.

One shortcoming of the electrical amplifiers 10 of FIGS. 1 and 2 is that if the load MD1 and/or MD2 has an inductive component—e.g. because of electrodes, metal interconnections or wire bonds—the positive feedback provided by the positive feedback loop 300 may lead to unwanted ringings.

In order to mitigate or circumvent this negative effect, it is possible to split the output transistors in two parts, where one of the two parts is biased and connected to the output load, as shown so far, and the other part has very little current and is connected to the coupling capacitor.

Figure 3:
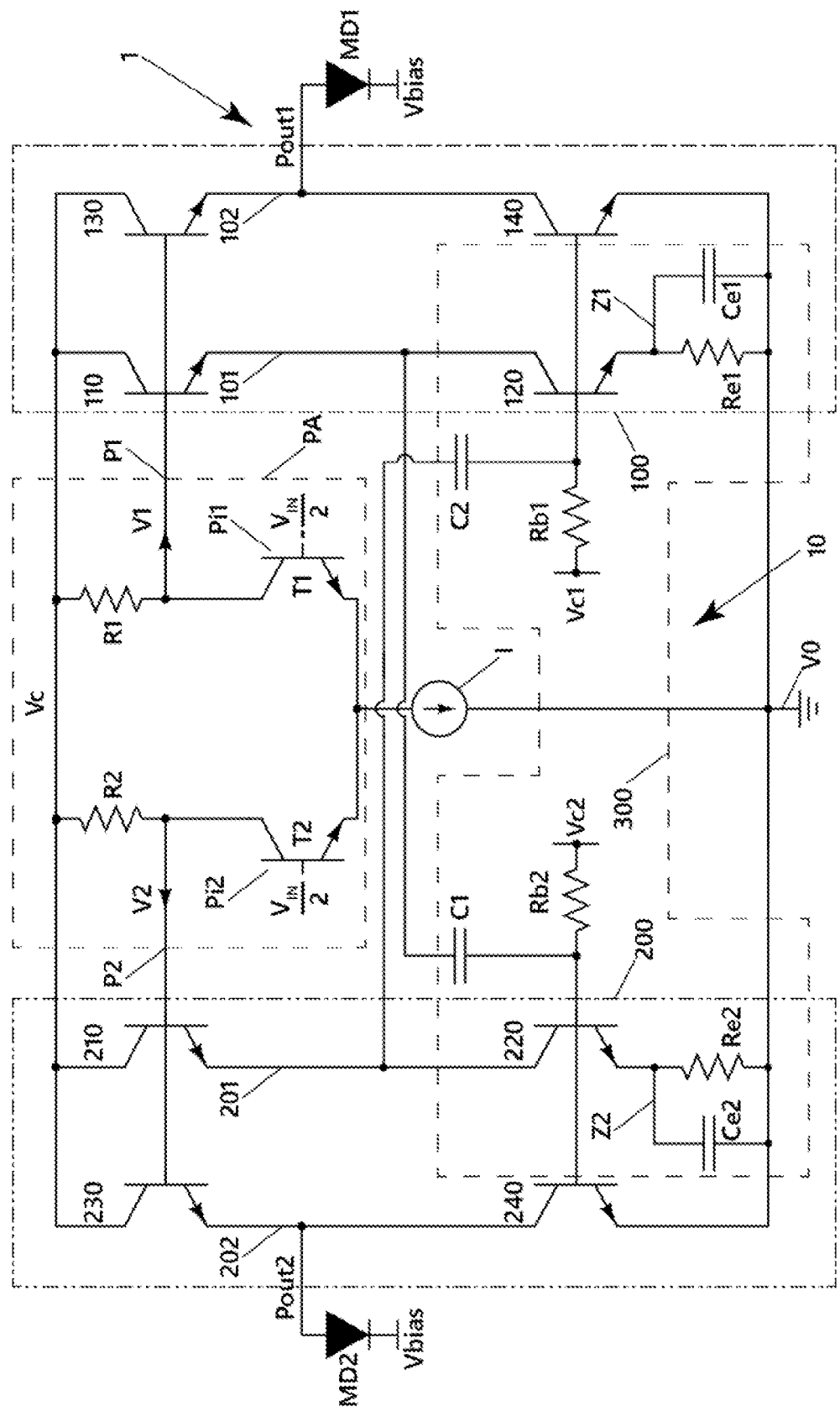
FIG. 3 illustrates a third exemplary embodiment of an electro-optical device and an electrical amplifier according to the present invention.

One possible implementation of this split-branch approach is shown in FIG. 3.

In the amplifier 10 of FIG. 3, the first output unit 100 comprises a first inner series circuit 101 and a first outer series circuit 102. The first inner series circuit 101 and the first outer series circuit 102 are connected in parallel relative to each other as well as parallel to the preamplifier PA.

The first inner series circuit 101 comprises a first inner emitter-follower unit 110 and a first inner bias transistor 120 connected in series with the first inner emitter-follower unit 110. The first outer series circuit 102 comprises a first outer emitter-follower unit 130 and a first outer bias transistor 140 connected in series with the first outer emitter-follower unit 130.

The second output unit 200 comprises a second inner series circuit 201 and a second outer series circuit 202, the second inner and outer series circuits 201, 202 being connected in parallel.

The second inner series circuit 201 comprises a second inner emitter-follower unit 210 and a second inner bias transistor 220 connected in series with the second inner emitter-follower unit 210.

The second outer series 202 circuit comprises a second outer emitter-follower unit 230 and a second outer bias transistor 240 connected in series with the second outer emitter-follower unit 230.

The emitter of the second inner emitter-follower unit 210 is connected to both a base of the first inner bias transistor 120 and a base of the first outer bias transistor 140 of the the first output unit 100 through the second capacitor C2 of a positive feedback loop 300. The emitter of the first inner emitter-follower unit 110 is connected to both a base of the second inner bias transistor 220 and a base of the second outer bias transistor 240 through the first capacitor C1 of the positive feedback loop.

The first output port P1 of the differential preamplifier PA is connected to both a base of the first inner emitter-follower unit 110 and a base of the first outer emitter-follower unit 130 of the first output unit 100. The second output port P2 of the differential preamplifier PA is connected to both a base of the second inner emitter-follower unit 210 and a base of the second outer emitter-follower unit 240 of the second output unit 200.

The emitter of the first outer emitter-follower unit 130 forms a first output port Pout1 of the electrical amplifier 10. The emitter of the second outer emitter-follower unit 230 forms a second output port Pout2 of the electrical amplifier 10.

The base of the first inner bias transistor 120 is connected to a common voltage source Vc1 via a first resistor Rb1. The base of the second inner bias transistor 220 is connected to the same or another common voltage source Vc2 via a second resistor Rb2.

The emitter of the first inner bias transistor 120 is connected to the reference potential V0 (e.g. earth potential) through a first impedance Z1. The emitter of the second inner bias transistor 220 is connected to the same or another reference potential V0 through a second impedance Z2.

The impedances Z1 and Z2 may comprise or consist of a parallel resonant circuit having a resistance Re1, Re2 in parallel with a first auxiliary capacitor Ce1, Ce2. The resistances Re1 and Re2 are preferably identical. The first auxiliary capacitors Ce1 and Ce2 are preferably identical.

In other words, in the exemplary embodiment of FIG. 3, the outer series circuits 102 and 202 are each biased via a Widlar current mirror (provided by the inner series circuits 101 and 201) in addition to the capacitors C1 and C2 in order to increase the gain of the positive feedback loop 300 at higher frequencies. Hence, the positive feedback loop 300 acts on the inner push-pull stages (the inner series circuits 101 and 201), and at the same time on the output pull-down elements (the outer series circuit 102 and 202).

FIG. 6, which had been already mentioned above in connection with the embodiments of FIGS. 1 and 3, also shows the effect of the split-branch approach of FIG. 3. The time-domain simulations clearly indicate that the transition time is significantly smaller in the embodiment of FIG. 3 compared to the embodiment of FIG. 1.

Figure 4:
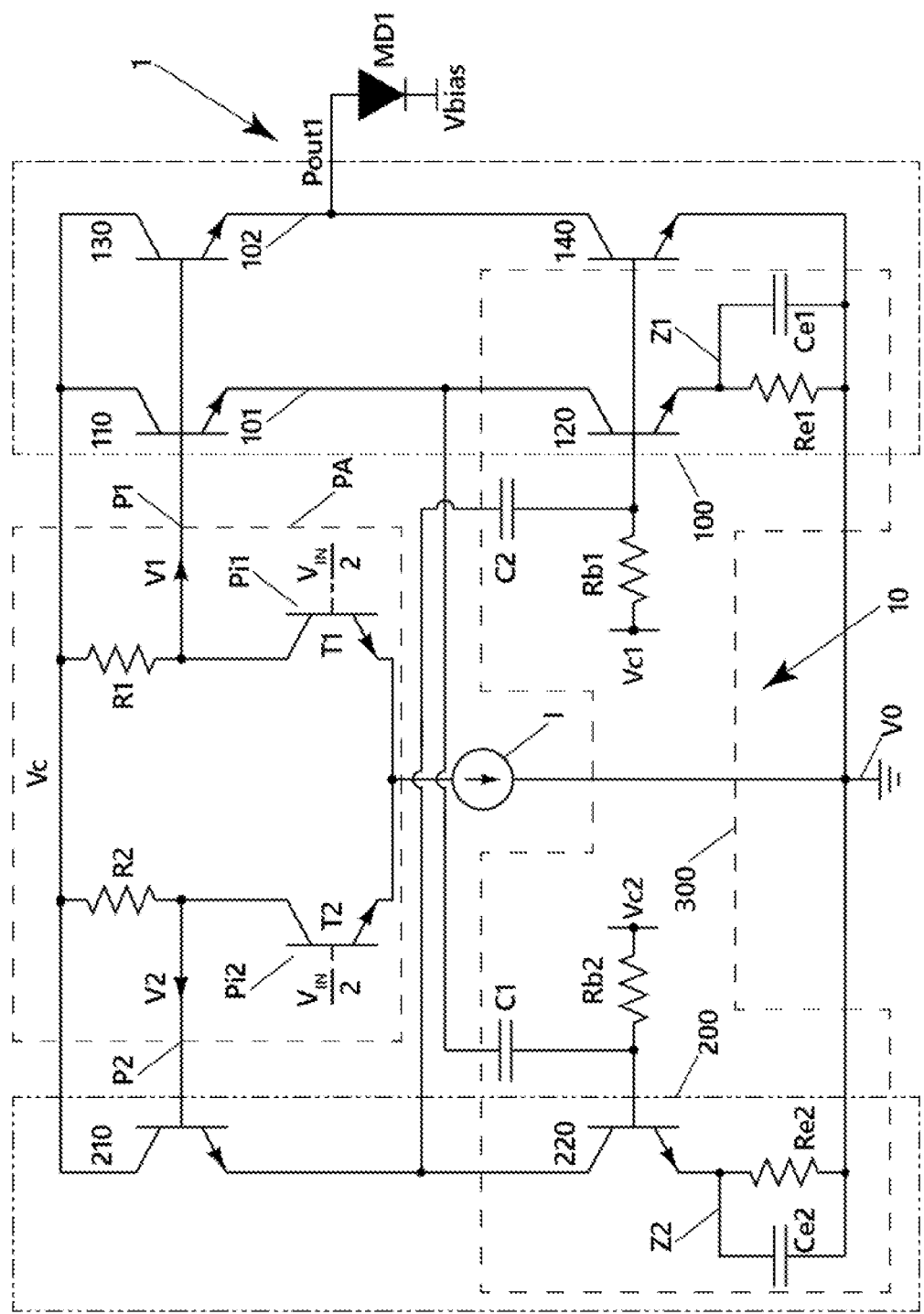
FIG. 4 illustrates a fourth exemplary embodiment of an electro-optical device and an electrical amplifier according to the present invention.

FIG. 4 shows a fourth exemplary embodiment of an electro-optical device 1 and an electrical amplifier 10 according to the present invention. The electrical amplifier 10 of FIG. 4 is single-ended and provides a single output Vout1, only. Therefore, the second outer series circuit 220 is not necessary and was discarded. The other features of the fourth embodiment of FIG. 4 are identical with those of the third embodiment of FIG. 3. Therefore, the explanations above with respect to the split-branch approach, the positive feedback loop 300, and their positive effect on the speed (e.g. the transition times of signal edges) are valid for the fourth exemplary embodiment as well.

Figure 7:
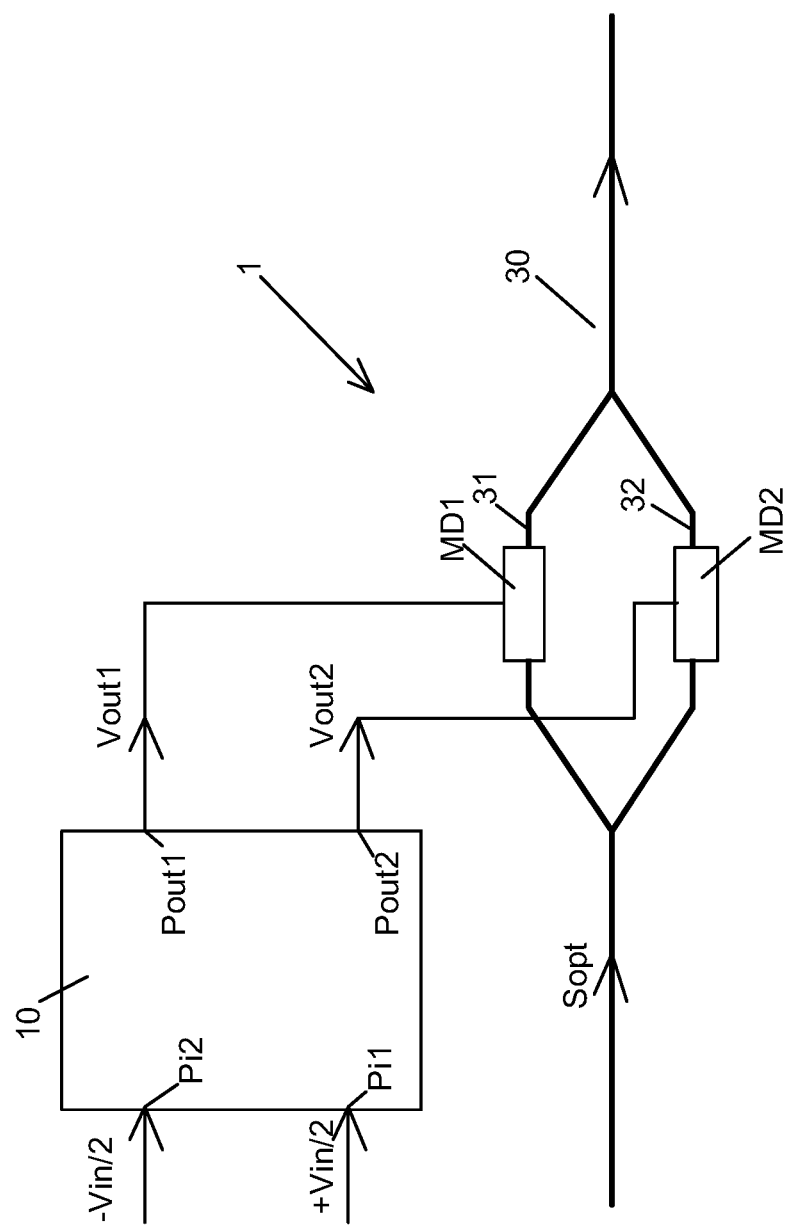
FIG. 7 illustrates an electro-optical device comprising a MZM in further detail.

FIG. 7 shows a fifth exemplary embodiment of an electro-optical device 1 and an electrical amplifier 10 according to the present invention. The electro-optical device 1 comprises a Mach-Zehnder interferometric modulator 30, e.g. based on SiPh. The output ports Pout1 and Pout 2 of the electrical amplifier 10 are connected with diodes MD1 of MD2 which are assigned to separate parallel interferometer arms 31 and 32 of the Mach-Zehnder interferometric modulator 30. Since the output signals Vout1 and Vout2 at the output ports Pout1 and Pout2 of the electrical amplifier 10 are inverse, the optical modulation of the optical input signal Sopt is optimal.

As discussed above, the loads MD1 and MD2 of the electro-optical device 1 are preferably Mach-Zehnder interferometric modulators based on SiPh-material. However, the principal of operation of the amplifier 10 of FIGS. 1-4 may also be applied to other types of optical modulators, such as electro-absorption modulators or any other type of electro-optic modulators that rely on the electro-optic effect to change the refractive index of a certain material through the application of an applied electric field. Thus, the invention described above is intended to embrace all such alternatives, modifications, applications and variations.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the world "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one ore more) of the present dependent claims (regardless of the present claim structure). Therefore, the applicant may direct further patent claims towards other claim combinations at a later stage of the prosecution.

The invention claimed is:

1. Electrical amplifier comprising
a differential preamplifier having a first output port and a second output port;
a first output unit connected to the first output port of the differential preamplifier and a second output unit connected to the second output port of the differential preamplifier, the first and second output units being electrically arranged in parallel relative to each other; and
a positive feedback loop that couples the first and second output units and comprises a first capacitor and a second capacitor;
wherein each of the first and second output units comprises an emitter-follower unit and a bias transistor that is connected in series with the emitter-follower unit of its output unit;
wherein an emitter of the emitter-follower unit of the first output unit is connected to a base of the bias transistor of the second output unit through the first capacitor of the positive feedback loop; and
wherein an emitter of the emitter-follower unit of the second output unit is connected to a base of the bias transistor of the first output unit through the second capacitor of the positive feedback loop.

2. Electrical amplifier of claim 1 wherein the emitter of the emitter-follower unit of the first output unit forms a first output port of the electrical amplifier.

3. Electrical amplifier of claim 2 wherein the emitter of the emitter-follower unit of the second output unit forms a second output port of the electrical amplifier.

4. Electrical amplifier of claim 1 wherein the base of the bias transistor of the first and/or second output unit is also connected to a common voltage source via a resistor.

5. Electrical amplifier of claim 1
wherein the first output port of the differential preamplifier is connected to a base of the emitter-follower unit of the first output unit; and
wherein the second output port of the differential preamplifier is connected to a base of the emitter-follower unit of the second output unit.

6. Electrical amplifier of claim 1
wherein the first output unit comprises an inner series circuit and an outer series circuit;
wherein the inner series circuit of the first output unit comprises said emitter-follower unit of the first output unit, hereinafter referred to as the inner emitter-follower unit, and said bias transistor of the first output unit, hereinafter referred to as the inner bias transistor, wherein the inner bias transistor is connected in series with the inner emitter-follower unit; and
wherein the outer series circuit of the first output unit comprises an outer emitter-follower unit and an outer bias transistor connected in series with the outer emitter-follower unit.

7. Electrical amplifier of claim 6
wherein the emitter of the emitter-follower unit of the second output unit is connected to a base of the inner bias transistor of the first output unit through the second capacitor of the positive feedback loop; and
wherein the emitter of the inner emitter-follower unit of the first output unit is connected to the base of the bias transistor of the second output unit through the first capacitor of the positive feedback loop.

8. Electrical amplifier of claim 6
wherein the emitter of the outer emitter-follower unit forms the first output port of the electrical amplifier.

9. Electrical amplifier of claim 6 wherein
the first output port of the differential preamplifier is connected to both a base of the inner emitter-follower unit and a base of the outer emitter-follower unit.

10. Electrical amplifier of claim 6 wherein
the inner series circuit of the first output unit comprises an impedance connected to the emitter of the inner bias transistor.

11. Electrical amplifier of claim 10 wherein
the impedance comprises a parallel resonant circuit having a resistance in parallel with a first auxiliary capacitor.

12. Electrical amplifier of claim 6 wherein
the second output unit comprises an impedance connected to an emitter of the bias transistor of the second output unit.

13. Electrical amplifier of claim 12 wherein
the impedance of the second output unit comprises a parallel resonant circuit having a resistance in parallel with a second auxiliary capacitor.

14. Electrical amplifier of claim 1
wherein the first output unit comprises a first inner series circuit and a first outer series circuit, the first inner and outer series circuits being connected in parallel;
wherein the first inner series circuit comprises said emitter-follower unit of the first output unit, hereinafter referred to as the first inner emitter-follower unit, and said bias transistor of the first output unit, hereinafter referred to as the first inner bias transistor, wherein the first inner bias transistor is connected in series with the first inner emitter-follower unit;
wherein the first outer series circuit comprises a first outer emitter-follower unit and a first outer bias transistor connected in series with the first outer emitter-follower unit;
wherein the second output unit comprises a second inner series circuit and a second outer series circuit, the second inner and outer series circuits being connected in parallel;
wherein the second inner series circuit comprises said emitter-follower unit of the second output unit, hereinafter referred to as the second inner emitter-follower unit, and said bias transistor of the second output unit, hereinafter referred to as the second inner bias transistor, wherein the second inner bias transistor is connected in series with the second inner emitter-follower unit; and
wherein the second outer series circuit comprises a second outer emitter-follower unit and a second outer bias transistor connected in series with the second outer emitter-follower unit.

15. Electrical amplifier of claim 14
wherein the emitter of the second inner emitter-follower unit is connected to both a base of the first inner bias transistor and a base of the first outer bias transistor through the second capacitor of the positive feedback loop; and
wherein the emitter of the first inner emitter-follower unit is connected to both a base of the second inner bias transistor and a base of the second outer bias transistor through the first capacitor of the positive feedback loop.

16. Electrical amplifier of claim 14 wherein
the first output port of the differential preamplifier is connected to both a base of the first inner emitter-follower unit and a base of the first outer emitter-follower unit;
the second output port of the differential preamplifier is connected to both a base of the second inner emitter-follower unit and a base of the second outer emitter-follower unit;
the emitter of the first outer emitter-follower unit forms a first output port of the electrical amplifier;
the emitter of the second outer emitter-follower unit forms a second output port of the electrical amplifier;
the base of the first inner bias transistor is connected to a common voltage source via a first resistor;
the base of the second inner bias transistor is connected to the same or another common voltage source via a second resistor;
the emitter of the first inner bias transistor is connected to a reference potential through a first impedance; and
the emitter of the second inner bias transistor is connected to the same or another reference potential through a second impedance.

17. Electrical amplifier of claim 1 wherein
at least one of the emitter-follower units is or comprises a npn-bipolar transistor.

18. Method of amplifying an electrical signal comprising the steps of:
pre-amplifying a differential input signal with a differential preamplifier having a first output port and a second output port;
feeding a first pre-amplified signal of the differential preamplifier into a first output unit and a second pre-amplified signal of the differential preamplifier into a second output unit, the first and second output units being electrically arranged in parallel relative to each other; and
providing a positive feedback by coupling the first and second output units via a first capacitor and a second capacitor;
wherein each of the first and second output units comprises an emitter-follower unit and a bias transistor that is connected in series with the emitter-follower unit of its output unit;
wherein an emitter of the emitter-follower unit of the first output unit is connected to a base of the bias transistor of the second output unit through the first capacitor; and
wherein an emitter of the emitter-follower unit of the second output unit is connected to a base of the bias transistor of the first output unit through the second capacitor.

19. Electro-optical device comprising an electrical amplifier comprising
a differential preamplifier having a first output port and a second output port;
a first output unit connected to the first output port of the differential preamplifier and a second output unit connected to the second output port of the differential preamplifier, the first and second output units being electrically arranged in parallel relative to each other; and
a first capacitor and a second capacitor that both couple the first and second output units;
wherein each of the first and second output units comprises an emitter-follower unit and a bias transistor that is connected in series with the emitter-follower unit of its output unit;
wherein an emitter of the emitter-follower unit of the first output unit is connected to a base of the bias transistor of the second output unit through the first capacitor; and wherein an emitter of the emitter-follower unit of the second output unit is connected to a base of the bias transistor of the first output unit through the second capacitor.

20. Electro-optical device of claim 19 further comprising an electro-optical modulator having at least one input port for inputting a modulation signal;

wherein at least one output port of the electrical amplifier is connected to said at least one input port of the electro-optical modulator.

* * * * *